US011901906B1

(12) United States Patent
Bhat et al.

(10) Patent No.: US 11,901,906 B1
(45) Date of Patent: Feb. 13, 2024

(54) HYBRID FRACTIONAL-N SAMPLING PHASE LOCKED LOOP (PLL) WITH ACCURATE DIGITAL-TO-TIME CONVERTER (DTC) CALIBRATION

(71) Applicant: Cisco Technology, Inc., San Jose, CA (US)

(72) Inventors: Abhishek Bhat, Allentown, PA (US); Romesh Kumar Nandwana, Chapel Hill, NC (US); Pavan Kumar Hanumolu, Champaign, IL (US); Kadaba Lakshmikumar, Hillsborough, NJ (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/887,709

(22) Filed: Aug. 15, 2022

(51) Int. Cl.
| *H03L 7/099* | (2006.01) |
| *G06N 3/063* | (2023.01) |
| *H03B 7/08* | (2006.01) |
| *H04B 1/16* | (2006.01) |
| *G06G 7/60* | (2006.01) |
| *G04F 10/00* | (2006.01) |
| *H03L 7/091* | (2006.01) |

(52) U.S. Cl.
CPC ............ *H03L 7/099* (2013.01); *G04F 10/005* (2013.01); *G06G 7/60* (2013.01); *G06N 3/063* (2013.01); *H03B 7/08* (2013.01); *H03L 7/091* (2013.01); *H04B 1/16* (2013.01)

(58) Field of Classification Search
CPC ....... G04F 10/005; H03L 7/099; H03L 7/091; G06G 7/60; H03B 7/08; H04B 1/16; G06N 3/063

USPC ................................. 331/1 A, 25, 16, 34, 18
See application file for complete search history.

(56) References Cited

U.S. PATENT DOCUMENTS

| 5,650,754 A | 7/1997 | Joshi et al. |
| 10,965,297 B1 | 3/2021 | Wu et al. |
| 10,996,634 B2 * | 5/2021 | Yao ..................... H03L 7/0991 |
(Continued)

OTHER PUBLICATIONS

"Voltage Controlled Oscillator—Usage of VCO, Working and Application," Elprocus, https://www.elprocus.com/voltage-controlled-oscillator-working-application, retrieved from the Internet May 30, 2022, 10 pages.
(Continued)

*Primary Examiner* — Arnold M Kinkead
(74) *Attorney, Agent, or Firm* — Edell, Shapiro & Finnan, LLC

(57) ABSTRACT

Presented herein are techniques for implementing a hybrid fractional-N sampling phase locked loop with accurate digital-to-time calibration. A method includes receiving, at a comparator, an output of a sampling phase detector of a phase locked loop, the output of the sampling phase detector of the phase locked loop also being supplied as a control source for a proportional control input of a voltage-controlled oscillator, supplying an output of the comparator as an input signal to a calibration loop of a digital-to-time converter, supplying an output of the digital-to-time converter to an input of the sampling phase detector, and supplying the output of the comparator as a control source for an integral control input of the voltage-controlled oscillator.

20 Claims, 7 Drawing Sheets

(56) References Cited

U.S. PATENT DOCUMENTS

2008/0106310 A1   5/2008  Lai et al.
2020/0177173 A1   6/2020  Wu et al.

OTHER PUBLICATIONS

Wanghua Wu, et al., "A 28-nm 75-fsrms Analog Fractional-N Sampling PLL With a Highly Linear DTC Incorporating Background DTC Gain Calibration and Reference Clock Duty Cycle Correction," IEEE Journal of Solid-State Circuits, vol. 54, No. 5, May 2019, 12 pages.
Ahmed Elkholy, et al., "A 2.0-5.5 GHZ Wide Bandwidth Ring-Based Digital Fractional-N PLL With Extended Range Multi-Modulus Divider," IEEE Journal of Solid-State Circuits, vol. 51, No. 8, Aug. 2016, 14 pages.
Wenjing Yin, et al., "A 0.7-to-3.5 GHZ 0.6-to-2.8 mW Highly Digital Phase-Locked Loop With Bandwidth Tracking," IEEE Journal of Solid-State Circuits, vol. 46, No. 8, Aug. 2011, 11 pages.

\* cited by examiner

HYBRID FRACTIONAL-N SAMPLING PHASE LOCKED LOOP (PLL) WITH ACCURATE DIGITAL-TO-TIME CONVERTER (DTC) CALIBRATION

TECHNICAL FIELD

The present disclosure relates to electronic circuitry, and in particular to a hybrid-fractional-N sampling phase locked loop (PLL) with digital-to-time converter (DTC) calibration to generate low jitter clock signals.

BACKGROUND

Higher data rate requirements in both wireline and wireless communication systems pose design challenges for clocking circuits. A PLL is one of the more critical building blocks used to generate low jitter on-chip clocks.

For example, in wireline systems, multiple clock generators are used in a single chip to accommodate multi-lane communication. Very low jitter clocks are needed to reduce error due to small timing margins with ever increasing data rates, e.g., 100 Gbps/lane and beyond. PLLs with low phase noise, low area, and low spurious tones are needed for these applications.

Wireless systems need low integrated phase error of a carrier signal to reduce the error vector magnitude (EVM). Spurious tones in the carrier should also be minimized to improve adjacent channel suppression. In addition, the phase noise of the carrier needs to be minimized to reduce reciprocal mixing. PLLs are thus also used in wireless applications.

To achieve low jitter in a fractional-N PLL, error cancellation is typically needed. However, most error cancellation techniques are susceptible to mismatches in the loop components.

DESCRIPTION OF EMBODIMENTS

Overview

Figure 1:
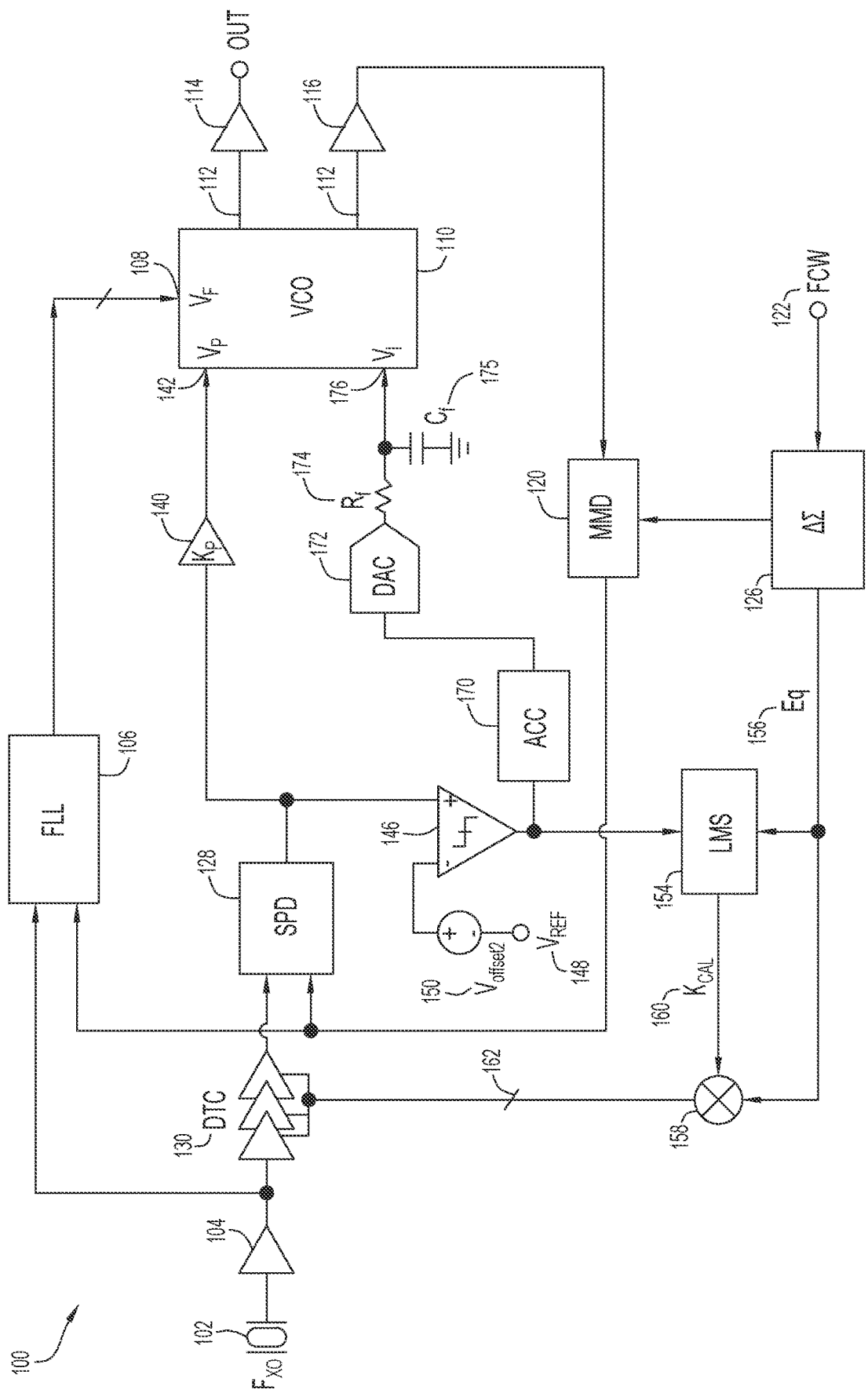
FIG. 1 is a circuit diagram of a hybrid Frac-N sampling PLL with accurate DTC calibration, according to an example embodiment.

Presented herein are techniques for implementing a hybrid fractional-N sampling phase locked loop with accurate digital-to-time converter calibration. A method includes receiving, at a comparator, an output of a sampling phase detector of a phase locked loop, the output of the sampling phase detector of the phase locked loop also being supplied as a control source for a proportional control input of a voltage-controlled oscillator, supplying an output of the comparator as an input signal to a calibration loop of a digital-to-time converter, supplying an output of the digital-to-time converter to an input of the sampling phase detector, and supplying the output of the comparator as a control source for an integral control input of the voltage-controlled oscillator.

In another embodiment, a device is provided. The device includes a voltage-controlled oscillator having a proportional input and an integral input, a sampling phase detector having an output that supplies a control signal for the proportional input to the voltage-controlled oscillator, a digital-to-time converter connected to an input of the sampling phase detector, a reference frequency generator that supplies a reference clock signal to the sampling phase detector via the digital-to-time convertor, which delays the clock signal based on a digital control word, and a digital-to-time converter control loop comprising a comparator that compares the output of the sampling phase detector to a reference voltage, and that controls an input of the digital-to-time converter, wherein the output of the comparator also supplies the control signal to control the integral control input of the voltage-controlled oscillator.

In still another embodiment a device includes a voltage-controlled oscillator, a voltage-controlled oscillator; a digital-to-time converter that is controlled by a digital-to-time converter calibration loop, the digital-to-time converter calibration loop having a comparator configured to receive an output of a sampling phase detector of a phase locked loop, the output of the sampling phase detector of the phase locked loop also being supplied as a control source for a proportional control input of the voltage-controlled oscillator, the digital-to-time converter calibration loop further configured to receive an output of the comparator and to provide a digital input to the digital-to-time converter, which provides an input to the sampling phase detector, and an output of the comparator configured to supply a control source for an integral control input of the voltage-controlled oscillator.

EXAMPLE EMBODIMENTS

As noted, a PLL is one of the more critical functional blocks in an integrated circuit chip. In a wireline system, multiple clock generators are used on a single chip to accommodate multi-lane communication. Very low jitter clocks are preferred in order to reduce the error that can result from small timing margins associated with increased data rates, e.g., 100G/λ. or 100 G/lane, and beyond. Thus, PLLs with low phase noise, small area, and low spurious tones are desired. Likewise, a wireless system benefits from low integrated phase error of a carrier to reduce the error vector magnitude (EVM). Spurious tones in the carrier are preferably minimized to improve adjacent channel suppression, and phase noise of the carrier is preferably minimized to reduce reciprocal mixing. Thus, again, there is a demand for improved PLL performance.

To address this demand, and in accordance with an embodiment, a hybrid Frac-N sampling PLL with accurate DTC calibration is provided that uses an output of a comparator, which is used in a DTC calibration loop, as a source of an input to the integral path digital accumulator of the PLL whose output is a source of an input to an integral control input of a voltage-controlled oscillator (VCO) of the PLL. In a conventional Frac-N sampling PLL, the integral control input of the VCO is fed by an output of a sampling phase detector (SPD) via a transconductance amplifier, which generates an output current proportional to the input voltage and accumulates it in the form of a voltage in a large integrating capacitor. In the hybrid Frac-N sampling PLL described herein, that transconductance amplifier and the associated large integrating capacitor is eliminated, and as such, a potential voltage offset mismatch (due, e.g., to temperature, random mismatch between transistors, etc.) between the comparator and the transconductance amplifier is also eliminated, resulting in a simpler, and more stable (lower jitter), PLL. The term "hybrid" is used to describe the disclosed PLL because the PLL comprises an analog proportional control path to the VCO, and, at least partially, a digital integral control path to the VCO. The hybrid nature of the Frac-N sampling PLL will become more apparent in connection with the discussion below of the figures.

Reference is now made first to FIG. 1, which is a circuit diagram of a hybrid Frac-N sampling PLL 100 with accurate DTC calibration, according to an example embodiment. As shown, a crystal oscillator 102 is configured to generate a fundamental frequency (clock) signal Fxo that is fed through buffer 104. An output of buffer 104 is fed to frequency locked loop (FLL) 106 whose output is fed to an input $V_F$ 108 of VCO 110 in the form of a digital word, which may, e.g., control a bank of capacitors (not shown) in VCO 110 to control a frequency output 112 (i.e., a source of a clock signal) of VCO 110. Frequency output 112 may be passed through a buffer 114. VCO 110 also provides its frequency output 112, via, possibly, a different buffer 116, to multi-modulus frequency divider (MMD) 120. MMD 120 is configured to generate a Frac-N representation of the frequency output 112 based on a frequency control word 122 supplied via a delta-sigma modulator 126. An output of MMD 120 is supplied as feedback to FLL 106, and is also fed as an input to sampling phase detector (SPD) 128. SPD 128 also receives, as input, an output from digital-to-time converter (DTC) 130, which is used to apply a delay to fundamental frequency signal Fxo, based on frequency control word (FCW) 122. DTC 130 is controlled directly by a digital word 162. The generation of digital word 162 is described further below.

An output of SPD 128 is supplied to amplifier Kp 140, which supplies a proportional control signal to proportional input Vp 142 of VCO 110. Amplifier Kp 140 is configured to amplify or attenuate the output of SPD 128 as desired for presentation to proportional input Vp 142 of VCO 110. The output of SPD 128 is also supplied, to the non-inverting input of a comparator 146. The inverting input of comparator 146 is tied to a voltage reference signal Vref 148, which may be subject to drift due, e.g., to temperature. The internal components of comparator 146 may also be subject to drift with temperature or random mismatch between its internal transistors. This overall drift is represented by $V_{offset2}$ 150.

As can be seen in FIG. 1, comparator 146 is part of a calibration (or control) loop for DTC 130. Specifically, the output of comparator 146 is fed to a least means square (LMS) calibration engine 154. LMS calibration engine 154 also receives a value of quantization noise (Eq) 156, which is also provided to a digital multiplier 158. Digital multiplier 158 multiplies the value of quantization noise (Eq) 156 with an output of LMS calibration engine 154, namely the calibration coefficient $K_{CAL}$ 160. The resulting product of the quantization noise (Eq) 156 and coefficient $K_{CAL}$ 160 is digital word 162, which is supplied to DTC 130.

As further shown in FIG. 1, not only is the output of comparator 146 used in a feedback or calibration loop to control DTC 130, but that same output is also used as a source signal for the integral input $V_1$ 176 of VCO 110. The proportional control input Vp 142, integral control input $V_1$ 176, and the digital input VF 108 represent three different control ports of VCO 110 such that the frequency of the frequency output 112 (clock signal) is a linear combination of voltages at these control ports multiplied by the respective forward path gains in Hz/V.

In a conventional Frac-N sampling PLL, the integral input of the VCO is fed by an output of the SPD via a transconductance amplifier, which generates an output current proportional to the input voltage and accumulates it in the form of a voltage in a large integrating capacitor. However, as is evident from FIG. 1, no such transconductance amplifier is employed in the hybrid Frac-N sampling PLL 100, according to an example embodiment.

Instead, as shown in FIG. 1, the output of comparator 146 is supplied to accumulator (ACC) 170 and an output thereof is supplied to digital-to-analog converter (DAC) 172. An output of DAC 172 is supplied, via an RC filter comprising Rf 174 and Cf 175 to integral input $V_1$ 176 of VCO 110. The RC filter at the output of the DAC is mainly employed to suppress noise of DAC 172 and output more stable voltage of DAC 172. It is noted that, in one possible embodiment, if DAC 172 has sufficiently high resolution and meets noise requirements, Rf 174 and Cf 175 can be eliminated.

In operation, comparator 146 in the calibration loop for DTC 130 is used to extract the sign of the SPD output. The digital +1, −1 signal is fed into LMS calibration engine 154, which correlates it with delta-sigma quantization noise (Eq) 156 and generates $K_{CAL}$, such that the input to the LMS correlator becomes zero.

In a conventional Frac-N sampling PLL, in which a transconductance amplifier is disposed between the output of SPD 128 and the integral input $V_1$ 176 of VCO 110, the output of SPD 128 should settle to a reference voltage $V_{REF}$ supplied to the transconductance amplifier (the same $V_{REF}$ 148 that is supplied to comparator 146), plus any offset ($V_{offset1}$ associated with such a transconductance amplifier), e.g., due to temperature. However, in the presence of comparator offset $V_{offset2}$ 150 (where $V_{offset2} \neq V_{offset1}$), comparator 146 might provide a continuous stream of +1 or −1 based on the offset voltage mismatch. This can lead to instability of the calibration loop, which can lead to large spurs and quantization noise folding into in-band frequency of the PLL, which leads to increased phase noise/jitter. In a worst case, in a conventional Frac-N sampling PLL with a transconductance amplifier supplying the integral input $V_1$ 176 of VCO 110, and where a mismatch exists between the reference voltages supplied to the transconductance amplifier and the comparator 146, the PLL can lose lock.

In contrast, with the topology of FIG. 1, the hybrid frac-N sampling PLL 100 solves these problems by eliminating the transconductance amplifier (and its associated $V_{offset1}$), thus eliminating potential component mismatch. Further, the hybrid Frac-N sampling PLL 100 leverages the output of the comparator 146 to supply a source of a control signal to the integral input $V_1$ 176 of VCO 110.

Notably, the circuit of FIG. 1 is insensitive to mismatch between the loop components of the PLL. Further, the hybrid sampling PLL 100 uses a digital loop filter and is thus highly scalable with transistor technology. The digital loop filter helps in building a PLL with low silicon area compared to a PLL with an analog loop filter, where the integrating capacitor consumes a large area. Further still, this approach of sharing comparator 146 for DTC calibration with the integral path of the PLL reduces the number of circuit components, thus simplifying the overall design.

Figure 2A:
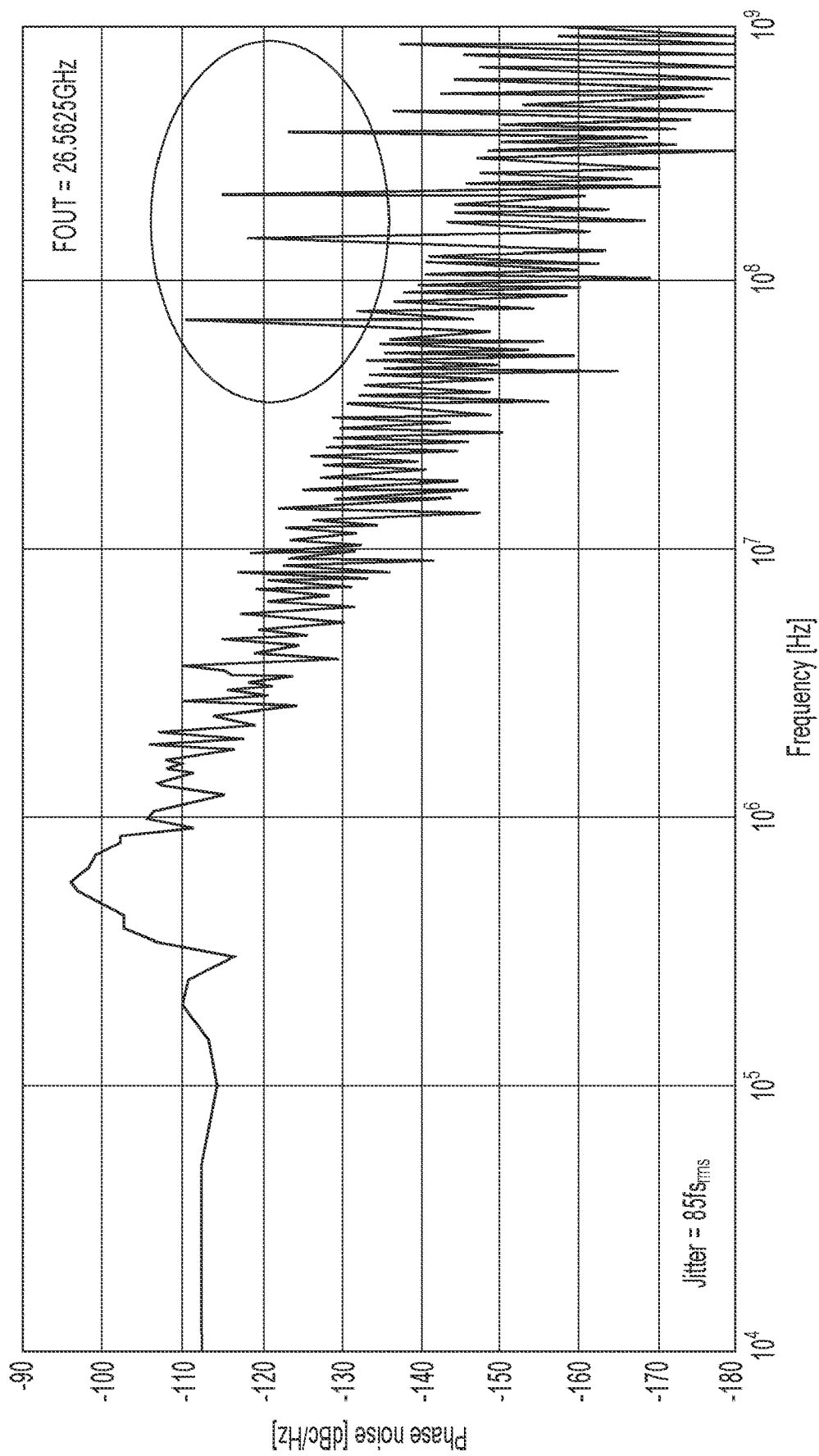
FIG. 2A is a graph showing the phase noise of a conventional Frac-N sampling PLL.
Figure 2B:
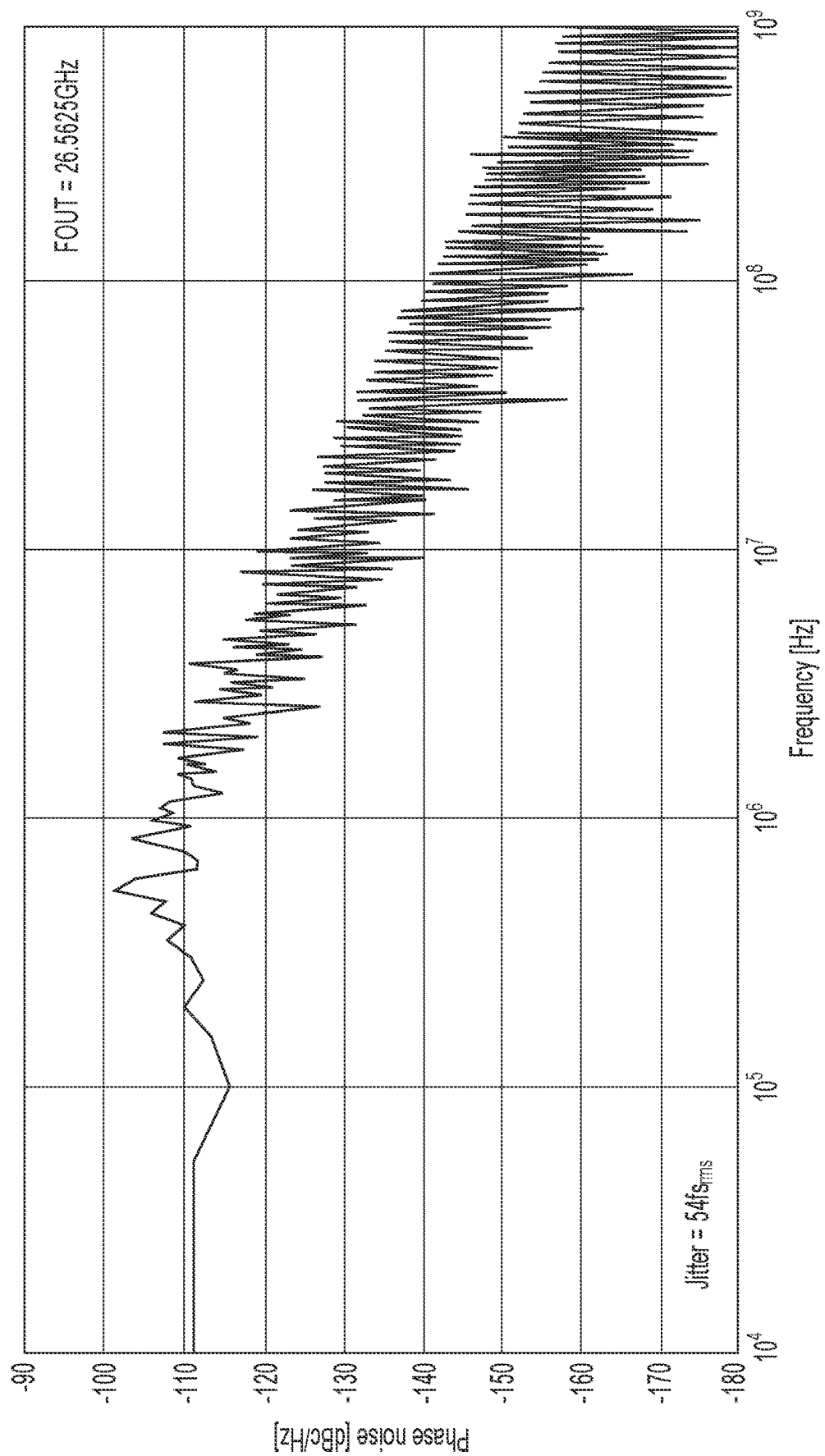
FIG. 2B is a graph showing, in comparison, the phase noise of the hybrid Frac-N sampling; PLL with accurate DTC calibration, according to an example embodiment.

FIG. 2A is a graph showing the phase noise of a conventional Frac-N sampling PLL wherein a transconductance amplifier with a large integrating capacitor feeds the integral input $V_1$ 176 of VCO 110. As can be seen in the graph, significant spurs in the output phase noise spectrum are present in the presence of offset voltage mismatch between comparator and transconductance amplifier, and this behavior leads to higher jitter. In contrast, FIG. 2B is a graph showing the phase noise of the hybrid Frac-N sampling PLL 100 with accurate DTC calibration, according to an example embodiment. The hybrid Frac-N sampling PLL 100 removes the instability caused by two different offsets due to the independent influence of the transconductance amplifier and comparator. With the hybrid Frac-N sampling PLL approach no significant spurs can be observed in the phase noise plot of FIG. 213. In one example simulation, integrated jitter (without voltage reference noise) improves from $85f_{Sms}$ to $54f_{Sms}$.

Figure 3:
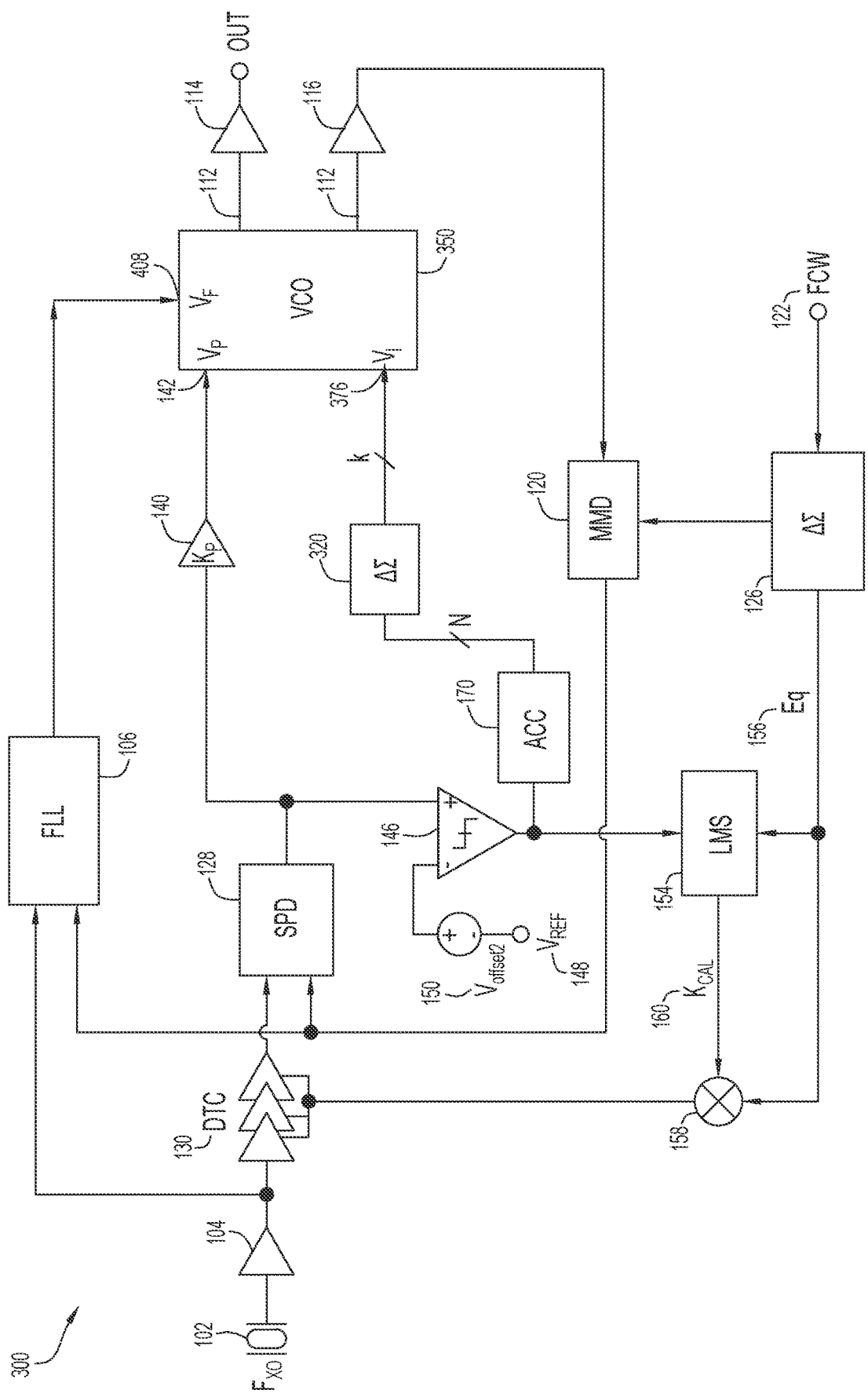
FIG. 3 is a circuit diagram showing an alternative approach to the hybrid Frac-N sampling PLL with accurate DTC calibration, according to an example embodiment.

FIG. 3 is a circuit diagram showing an alternative hybrid Frac-N sampling PLL 300 with accurate DTC calibration, according to an example embodiment. In this approach, the integral path can be made completely digital by employing fine digital control bits for the integral port $V_1$ 476 of VCO 350. The following discussion focuses on the differences between FIG. 1 and the alternative approach illustrated in FIG. 3. In FIG. 3, hybrid Frac-N sampling PLL 300 replaces DAC 172 and follow-on RC filter, with a (digital) delta-sigma modulator 320, which can be used to truncate the N bit output of accumulator 170 to k bits matching the (digital) integral input $V_1$ 376 of VCO 350. The high frequency noise of the delta-sigma modulator 320 is filtered by the low pass (Kvco/s) transfer function of VCO 350. A reduction in area is realized by eliminating the RC filter, but this may come with a small penalty in jitter of the frequency output 112 of VCO 350. It is noted that, in some embodiments, the delta-sigma modulator 320 can be eliminated and accumulator output can be directly fed to digital control of $V_1$ 376 of VCO 350.

As those skilled in the art will appreciate, the hybrid Frac-N sampling PLL 100 (300) with accurate DTC calibration can be used to generate low jitter clocks.

The technique described herein solves the problem of mismatch between offsets of a comparator used for DTC gain calibration and a transconductance amplifier that is used, conventionally, for integral control in the main PLL loop.

The designs described herein also greatly reduce the area requirement of the PLL, due to the use of digital accumulator/integrator as a part of the loop filter.

The techniques improve the settling time of a Frac-N sampling PLL by eliminating the settling time of a comparator offset compensation loop that might be employed. That is, when temperature drifts, the comparator's offset will also change with it. In a conventional sampling frac-N PLL, a comparator feeds both the LMS loop for the DTC gain calibration and its offset calibration loop. It is desirable, but difficult, to have these loops react to temperature change simultaneously for jitter to be stable. In the embodiments described herein, by removing the transconductance amplifier (and its relatively large filter capacitor/integrator) and using a single comparator (comparator 146) for the VCO integral path and DTC calibration, there is no longer any need for comparator offset calibration as that can be taken care of by the PLL loop itself. In accordance with the techniques described herein, only the DTC calibration loop needs to run for optimal performance. This makes results in a fundamental change enabling the hybrid Frac-N sampling PLL to operate in a stable fashion over dynamic change in temperatures.

This design reduces the number of components in a Frac-N sampling PLL, thus reducing the design complexity for the same performance. Also, the number of "analog" components in the PLL is reduced, making it more scalable.

Figure 4:
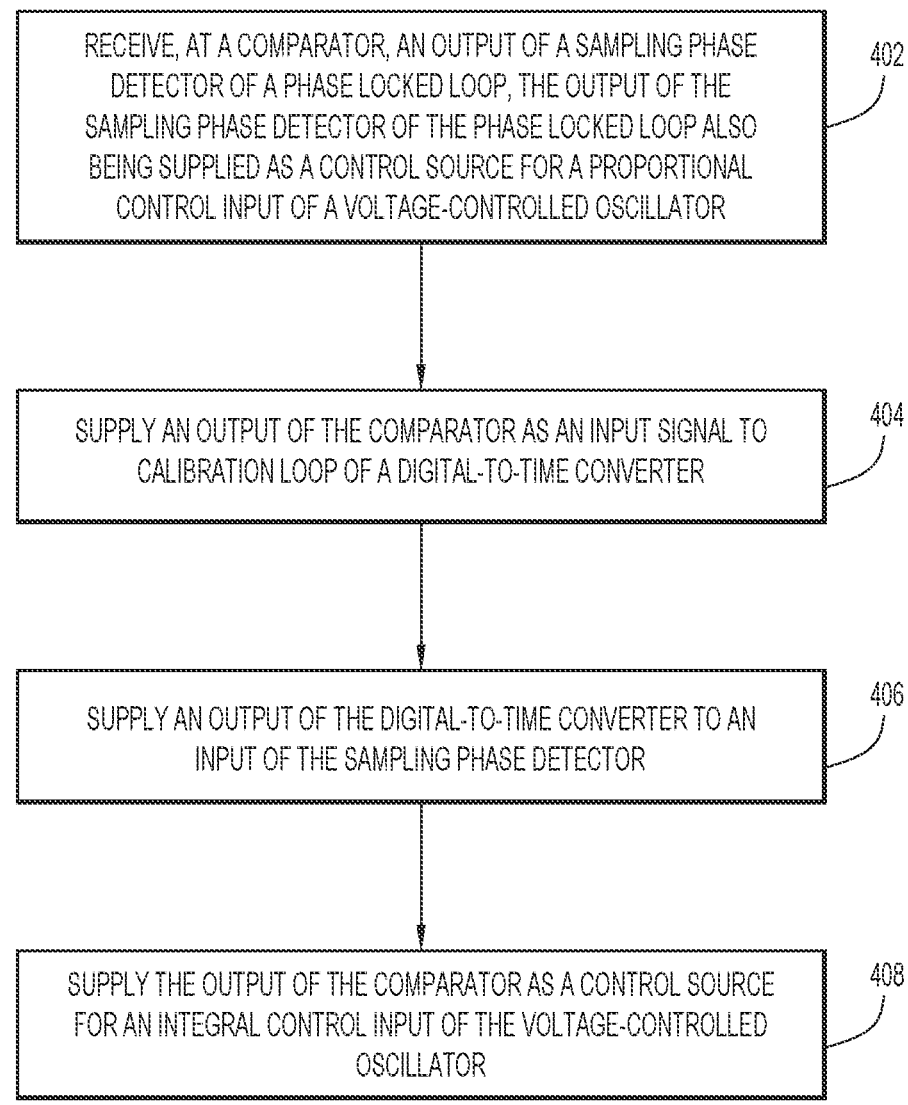
FIG. 4 is a flow chart showing a series of operations carried out by the hybrid Frac-N sampling PLL with accurate DTC calibration, according to an example embodiment.

FIG. 4 is a flow chart showing a series of operations carried out by the hybrid Frac-N sampling PLL with accurate DTC calibration, according to an example embodiment. At 402, an operation is configured to receive, at a comparator, an output of a sampling phase detector of a phase locked loop, the output of the sampling phase detector of the phase locked loop also being supplied as a control source for a proportional control input of a voltage-controlled oscillator. At 404, an operation is configured to supply an output of the comparator as an input signal to a calibration loop of a digital-to-time converter. At 406, an operation is configured to supply an output of the digital-to-time converter to an input of the sampling phase detector. And, at 408, an operation is configured to supply the output of the comparator as a control source for an integral control input of the voltage-controlled oscillator.

Figure 5:
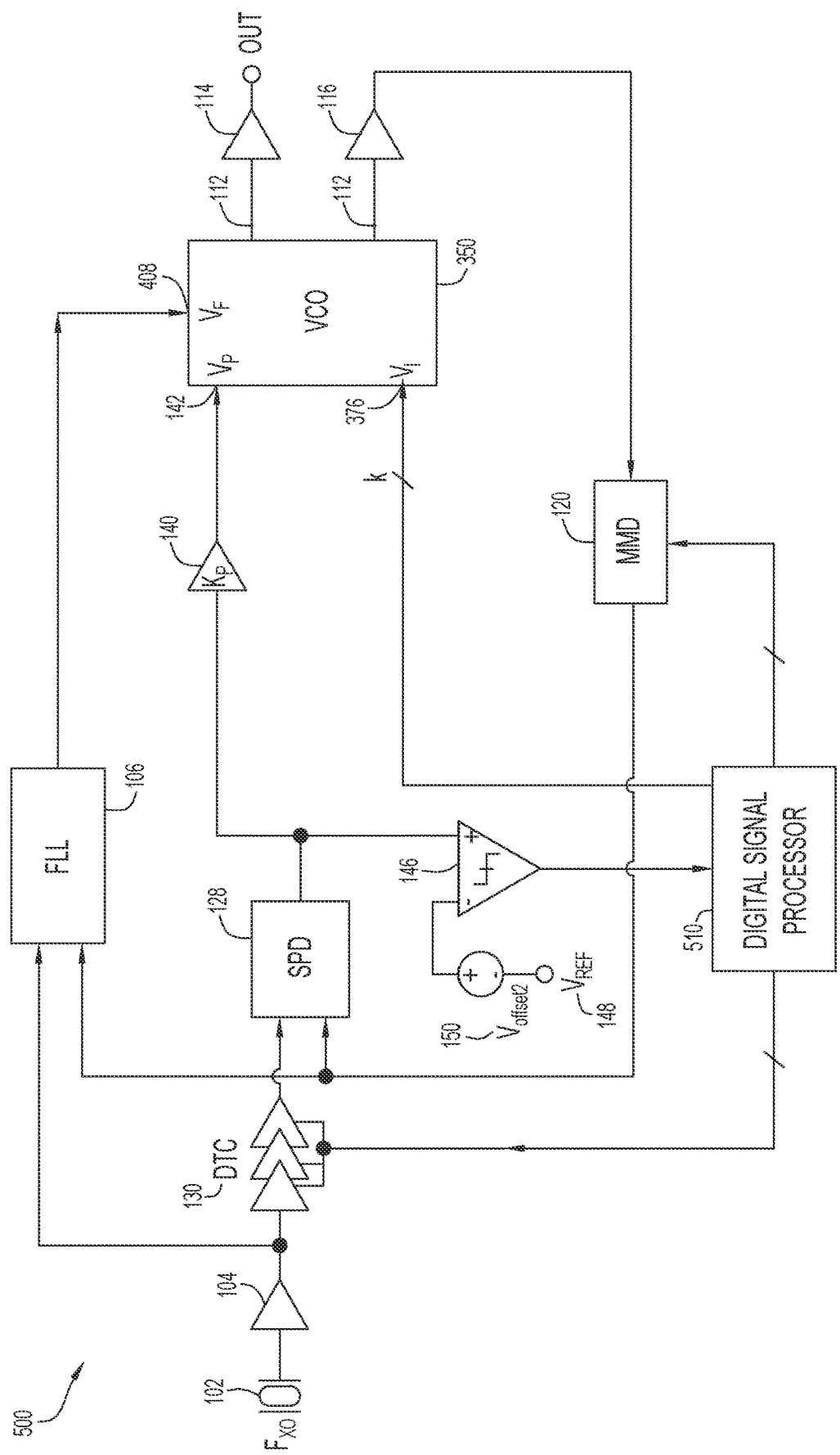
FIG. 5 is a circuit diagram showing yet another alternative approach to the hybrid Frac-N sampling PLL with accurate DTC calibration, according to an example embodiment.

FIG. 5 is a circuit diagram showing yet another alternative approach to the hybrid Frac-N sampling PLL with accurate DTC calibration, according to an example embodiment. In this figure, hybrid Frac-N sampling PLL 500, the digital processing functionality of, e.g., LMS engine 154, ACC 170, delta-sigma modulator 126, and delta-sigma modulator 320 shown in FIG. 3, can be implemented in a digital signal processor 510 (DSP) or microprocessor. It would also be possible to encode a general purpose central processing unit (CPU) to process the digital functions of the hybrid Frac-N sampling PLL 100, 300 or 500, and controlled with appropriate firmware/software. Such a CPU may be the one or more processors described with reference to FIG. 6.

Figure 6:
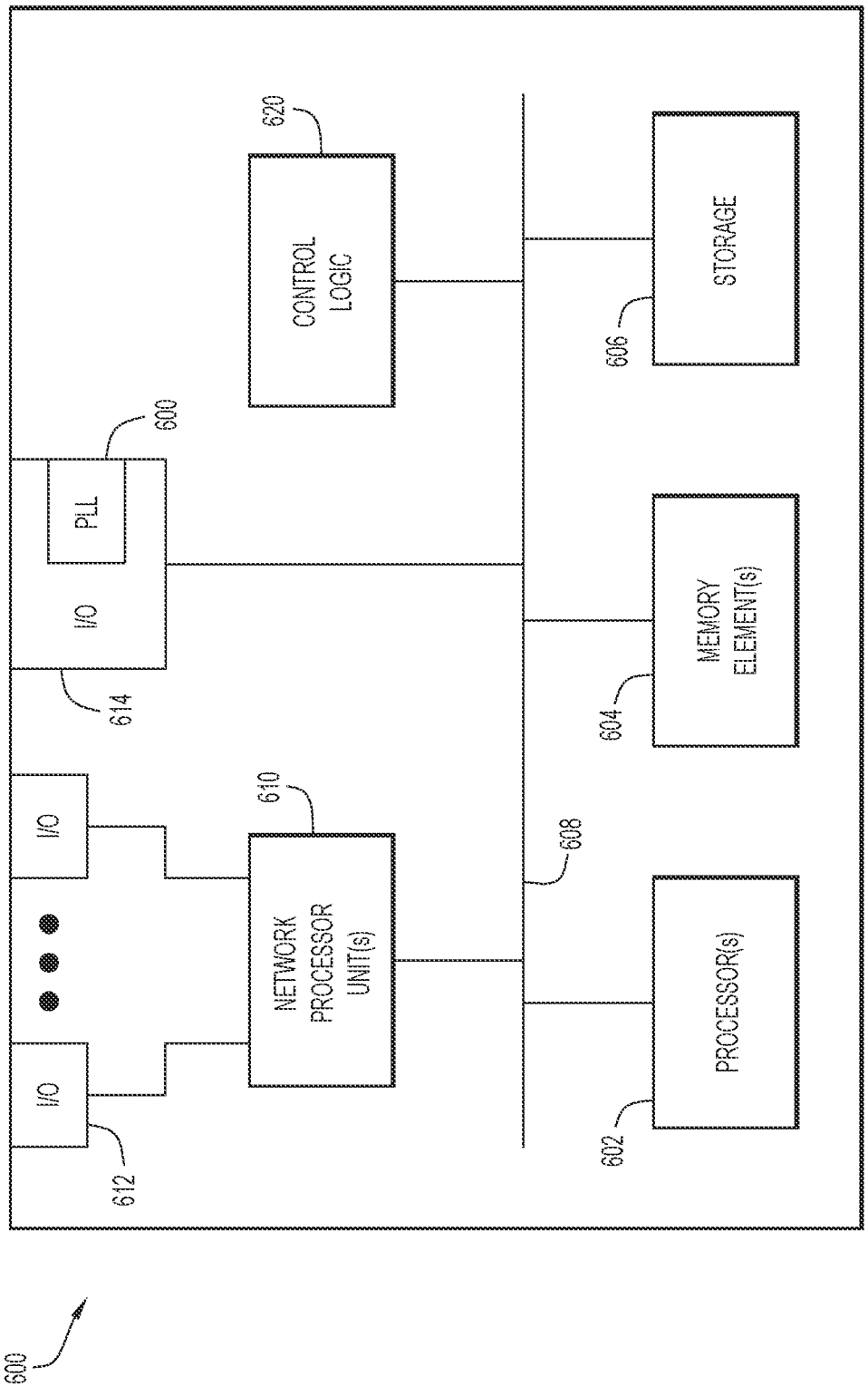
FIG. 6 is a block diagram of a device that may be configured to include the hybrid Frac-N sampling PLL with accurate DTC calibration, according to an example embodiment.

FIG. 6 is a block diagram of a device that may be configured to include the hybrid Frac-N sampling PLL 100 with accurate DTC calibration, according to an example embodiment. In at least one embodiment, the computing device 600 may include one or more processor(s) 602, one or more memory element(s) 604, storage 606, a bus 608, one or more network processor unit(s) 610 interconnected with one or more network input/output (I/O) interface(s) 612, one or more I/O interface(s) 614, and control logic 620. In various embodiments, instructions associated with logic for computing device 600 can overlap in any manner and are not limited to the specific allocation of instructions and/or operations described herein.

In at least one embodiment, processor(s) 602 is/are at least one hardware processor configured to execute various tasks, operations and/or functions for computing device 600 as described herein according to software and/or instructions configured for computing device 600. Processor(s) 602 (e.g., a hardware processor) can execute any type of instructions associated with data to achieve the operations detailed herein. In one example, processor(s) 602 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 604 and/or storage 606 is/are configured to store data, information, software, and/or instructions associated with computing device 600, and/or logic configured for memory element(s) 604 and/or storage 606. For example, any logic described herein (e.g., control logic 620) can, in various embodiments, be stored for computing device 600 using any combination of memory element(s) 604 and/or storage 606. Note that in some embodiments, storage 606 can be consolidated with memory element(s) 604 (or vice versa), or can overlap/exist in any other suitable manner.

In at least one embodiment, bus 608 can be configured as an interface that enables one or more elements of computing device 600 to communicate in order to exchange information and/or data. Bus 608 can be implemented with any architecture designed for passing control, data and/or information between processors, memory elements/storage, peripheral devices, and/or any other hardware and/or software components that may be configured for computing device 600. In at least one embodiment, bus 608 may be implemented as a fast kernel-hosted interconnect, potentially using shared memory between processes (e.g., logic), which can enable efficient communication paths between the processes.

In various embodiments, network processor unit(s) 610 may enable communication between computing device 600 and other systems, entities, etc., via network I/O interface(s) 612 (wired and/or wireless) to facilitate operations discussed for various embodiments described herein. In various embodiments, network processor unit(s) 610 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 600 and other systems, entities, etc. to facilitate operations for various embodiments described herein. In various embodiments, network I/O interface(s) 612 can be configured as one or more Ethernet port(s), Fibre Channel ports, any other I/O port(s), and/or antenna(s)/antenna array(s) now known or hereafter developed. Thus, the network processor unit(s) 610 and/or network I/O interface(s) 612 may include suitable interfaces for receiving, transmitting, and/or otherwise communicating data and/or information in a network environment.

I/O interface(s) 614 allow for input and output of data and/or information with other entities that may be connected to computing device 600. For example, I/O interface(s) 614 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 620 can include instructions that, when executed, cause processor(s) 602 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 620) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 604 and/or storage 606 can store data, software, code, instructions (e.g., processor instructions), logic, parameters, combinations thereof, and/or the like used for operations described herein. This includes memory element(s) 604 and/or storage 606 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™ mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of can be represented using the'(s)' nomenclature (e.g., one or more element(s)).

In sum, in one embodiment a method is provided. The method may include receiving, at a comparator, an output of a sampling phase detector of a phase locked loop, the output of the sampling phase detector of the phase locked loop also being supplied as a control source for a proportional control input of a voltage-controlled oscillator, supplying an output of the comparator as an input signal to a calibration loop of a digital-to-time converter, an output of digital-to-time converter, supplying an output of the digital-to-time converter to an input of the sampling phase detector, and supplying the output of the comparator as a control source for an integral control input of the voltage-controlled oscillator.

The method may further include supplying the output of the comparator to an accumulator.

The method may further include supplying an output of the accumulator to a digital-to-analog converter.

The method may further include supplying an output of the digital-to-analog converter to an RC filter.

The method may further include supplying an output of the RC filter to the integral control input of the voltage-controlled oscillator.

The method may further include amplifying or attenuating the output of the sampling phase detector of the phase locked loop prior to supplying the output of the sampling phase detector of the phase locked loop to the proportional control input of the voltage-controlled oscillator.

The method may still further include driving the phase locked loop with a crystal oscillator.

In the method, the phase locked loop may be a fractional-N sampling phase locked loop.

The method may further include inputting an analog signal, based on the output of the comparator, to the integral control input of the voltage-controlled oscillator.

The method may also include inputting a digital signal, based on the output of the comparator, to the integral control input of the voltage-controlled oscillator.

A device may also be provided. The device may include a voltage-controlled oscillator having a proportional control input and an integral control input, a sampling phase detector having an output that supplies a control signal for the proportional input to the voltage-controlled oscillator, a digital-to-time converter connected to an input of the sampling phase detector, a reference frequency generator that supplies a reference frequency clock signal to the sampling phase detector via the digital-to-time converter, and a digital-to-time converter control loop, comprising a comparator that compares the output of the sampling phase detector to a reference voltage, and that controls an input of the digital-to-time converter, wherein the output of the comparator also supplies the control signal to control the integral control input of the voltage-controlled oscillator.

In the device a signal path between an output of the comparator and the integral control input of the voltage-controlled oscillator may include an accumulator, a digital-to-analog converter, and an RC filter.

The device may further include a multi-modulus frequency divider that is connected to an output of the voltage-controlled oscillator.

The device may further include a delta-sigma modulator configured to receive a frequency control word and to output a control signal to the multi-modulus frequency divider.

The device may further include a least mean square module connected to an output of the comparator.

The device may be configured as a fractional-N sampling phase locked loop.

In another embodiment, a device is provided and includes a voltage-controlled oscillator, a digital-to-time converter that is controlled by a digital-to-time converter calibration loop, the digital-to-time converter calibration loop having a comparator configured to receive an output of a sampling phase detector of a phase locked loop, the output of the sampling phase detector of the phase locked loop also being supplied as a control source for a proportional control input of the voltage-controlled oscillator, the digital-to-time converter calibration loop further configured to receive an output of the comparator and to provide a digital input to the digital-to-time converter, which provides an input to the sampling phase detector, and an output of the comparator configured to supply a control source for an integral control input of the voltage-controlled oscillator.

In the device, a signal path between the output of the comparator and the integral control input of the voltage-controlled oscillator may include an accumulator, a digital-to-analog converter, and an RC filter.

The device may further include a multi-modulus frequency divider that is connected to an output of the voltage-controlled oscillator.

The device may still further include a delta-sigma modulator configured to receive a frequency control word and to output a control signal to the multi-modulus frequency divider and a quantization noise signal to the digital-to-time converter calibration loop.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A method comprising:
    receiving, at a comparator, an output of a sampling phase detector of a phase locked loop, the output of the sampling phase detector of the phase locked loop also being supplied as a control source for a proportional control input of a voltage-controlled oscillator;
    supplying an output of the comparator as an input signal to a calibration loop of a digital-to-time converter;
    supplying an output of the digital-to-time converter to an input of the sampling phase detector; and
    supplying the output of the comparator as a control source for an integral control input of the voltage-controlled oscillator,
    wherein a circuit path between the comparator and the integral control input of the voltage-controlled oscillator is devoid of a transconductance amplifier.

2. The method of claim 1, further comprising, supplying the output of the comparator to an accumulator.

3. The method of claim 2, further comprising supplying an output of the accumulator to a digital-to-analog converter.

4. The method of claim 3, further comprising supplying an output of the digital-to-analog converter to an RC filter.

5. The method of claim 4, further comprising supplying an output of the RC filter to the integral control input of the voltage-controlled oscillator.

6. The method of claim 1, further comprising amplifying or attenuating the output of the sampling phase detector of the phase locked loop prior to supplying the output of the sampling phase detector of the phase locked loop to the proportional control input of the voltage-controlled oscillator.

7. The method of claim 1, further comprising driving the phase locked loop with a crystal oscillator.

8. The method of claim 1, wherein the phase locked loop is a fractional-N sampling phase locked loop.

9. The method of claim 1, further comprising inputting an analog signal, based on the output of the comparator, to the integral control input of the voltage-controlled oscillator.

10. The method of claim 1, further comprising inputting a digital signal, based on the output of the comparator, to the integral control input of the voltage-controlled oscillator.

11. A device comprising:
a voltage-controlled oscillator having a proportional control input and an integral control input;
a sampling phase detector having an output that supplies a control signal for the proportional control input to the voltage-controlled oscillator;
a digital-to-time converter connected to an input of the sampling phase detector;
a reference frequency generator that supplies a reference frequency clock signal to the sampling phase detector via the digital-to-time converter; and
a digital-to-time converter control loop, comprising a comparator that compares the output of the sampling phase detector to a reference voltage, that controls an input of the digital-to-time converter,
wherein the output of the comparator also supplies the control signal to control the integral control input of the voltage-controlled oscillator, and
wherein a circuit path between the comparator and the integral control input of the voltage-controlled oscillator is devoid of a transconductance amplifier.

12. The device of claim 11, wherein a signal path between an output of the comparator and the integral control input of the voltage-controlled oscillator comprises an accumulator, a digital-to-analog converter, and an RC filter.

13. The device of claim 11, further comprising a multi-modulus frequency divider that is connected to an output of the voltage-controlled oscillator.

14. The device of claim 13, further comprising a delta-sigma modulator configured to receive a frequency control word and to output a control signal to the multi-modulus frequency divider.

15. The device of claim 11, further comprising a least mean square module connected to an output of the comparator.

16. The device of claim 11, wherein the device is a fractional-N sampling phase locked loop.

17. A device comprising:
a voltage-controlled oscillator;
a digital-to-time converter that is controlled by a digital-to-time converter calibration loop, the digital-to-time converter calibration loop having a comparator configured to receive an output of a sampling phase detector of a phase locked loop, the output of the sampling phase detector of the phase locked loop also being supplied as a control source for a proportional control input of the voltage-controlled oscillator;
the digital-to-time converter calibration loop further configured to receive an output of the comparator and to provide a digital input to the digital-to-time converter, which provides an input to the sampling phase detector; and
an output of the comparator configured to supply a control source for an integral control input of the voltage-controlled oscillator,
wherein a circuit path between the comparator and the integral control input of the voltage-controlled oscillator is devoid of a transconductance amplifier.

18. The device of claim 17, wherein a signal path between the output of the comparator and the integral control input of the voltage-controlled oscillator comprises an accumulator, a digital-to-analog converter, and an RC filter.

19. The device of claim 17, further comprising a multi-modulus frequency divider that is connected to an output of the voltage-controlled oscillator.

20. The device of claim 19, further comprising a delta-sigma modulator configured to receive a frequency control word and to output a control signal to the multi-modulus frequency divider and a quantization noise signal to the digital-to-time converter calibration loop.

* * * * *